US007253067B2

(12) United States Patent
Abe

(10) Patent No.: US 7,253,067 B2
(45) Date of Patent: Aug. 7, 2007

(54) METHOD FOR MANUFACTURING A SEMICONDUCTOR DEVICE INCLUDING A SHALLOW TRENCH ISOLATION STRUCTURE

(75) Inventor: Kanshi Abe, Yamagata (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/190,030

(22) Filed: Jul. 26, 2005

(65) Prior Publication Data

US 2006/0079063 A1    Apr. 13, 2006

(30) Foreign Application Priority Data

Sep. 30, 2004  (JP)  ............... 2004-288673

(51) Int. Cl.
*H01L 21/336*  (2006.01)
(52) U.S. Cl. ...................... 438/306; 438/372; 438/373; 438/514
(58) Field of Classification Search ........ 438/301–306, 438/372–376, 514–521
See application file for complete search history.

(56) References Cited

U.S. PATENT DOCUMENTS 6,083,783 A * 7/2000 Lin et al. .................... 438/199

7,049,199 B2 * 5/2006 Layman et al. ............. 438/302

FOREIGN PATENT DOCUMENTS

JP  2003-229496  8/2003

* cited by examiner

*Primary Examiner*—Dung A. Le
(74) *Attorney, Agent, or Firm*—Harness, Dickey & Pierce, P.L.C.

(57) ABSTRACT

A method of manufacturing a semiconductor device having a semiconductor substrate that includes an active region for forming transistor elements, which includes a gate, and an element isolation region for isolating the transistor elements separately each other, which has a STI structure, the method comprises; first—ion implanting fist ions onto the surface of the semiconductor substrate in a region other than a stress region in the active region, which is located at the interface with the element isolation region, in the stress region, a potential stress is generated by forming the element isolation region and/or the difference between a material of the element isolation region and a material of the semiconductor substrate, so that a first impurity region for a source and/or a drain is formed in the active region in which the gate is not formed; and second ion implanting second ions each of which mass is smaller than that of each of the first ions so that a second ion impurity region is formed in the stress region.

3 Claims, 2 Drawing Sheets

1 ··· SILICON SUBSTRATE
2 ··· ACTIVE REGION
3 ··· STI REGION
4 ··· STRESS REGION
5 ··· GATE
6 ··· GATE INSULATING FILM
7 ··· GATE ELECTRODE
8 ··· SOURCE REGION
9 ··· DRAIN REGION
12 ··· FIRST IMPURITY REGION
13 ··· SECOND PHOTO RESIST
14 ··· SECOND ION
15 ··· SECOND IMPURITY REGION

1 ··· SILICON SUBSTRATE
2 ··· ACTIVE REGION
3 ··· STI REGION
4 ··· STRESS REGION
5 ··· GATE
6 ··· GATE INSULATING FILM
7 ··· GATE ELECTRODE
8 ··· SOURCE REGION
9 ··· DRAIN REGION
10 ··· FIRST PHOTO RESIST
11 ··· FIRST ION
12 ··· FIRST IMPURITY REGION

1 ··· SILICON SUBSTRATE
2 ··· ACTIVE REGION
3 ··· STI REGION
4 ··· STRESS REGION
5 ··· GATE
6 ··· GATE INSULATING FILM
7 ··· GATE ELECTRODE
8 ··· SOURCE REGION
9 ··· DRAIN REGION
12 ··· FIRST IMPURITY REGION
13 ··· SECOND PHOTO RESIST
14 ··· SECOND ION
15 ··· SECOND IMPURITY REGION

METHOD FOR MANUFACTURING A SEMICONDUCTOR DEVICE INCLUDING A SHALLOW TRENCH ISOLATION STRUCTURE

RELATED APPLICATIONS

This application claims priority to Japanese Patent Application No. 2004-288673 filed Sep. 30, 2004 which is hereby expressly incorporated by reference herein in its entirety.

BACKGROUND OF THE INVENTION

1. Technical Field

The present invention relates a semiconductor device and a method of manufacturing the same. More specifically, it relates a method of forming a source and/or a drain of a transistor element by ion implantation and its structure.

2. Related Arts

Recently, shallow trench isolation (STI) has been adapted to an element isolation region accompanied with miniaturization of a transistor size formed on a silicon substrate. A STI structure includes a trench in a semiconductor substrate and a silicon oxide film within it, yielding in a potential stress between an active region for a transistor element and a silicon oxide film in the STI.

When an impurity is doped into an active region in a silicon substrate by an ion implantation method for forming a source and/or a drain, the interface between the STI region and the active region receives damages by ion implantation. In order to release such potential stress, a defect such as dislocation in active region side, namely pure crystalline silicon substrate is yielded.

In such case, many of these defects cause defects of electric properties such as increase of leak current and decrease of break down voltage, when a transistor element is turned on.

In order to solve this issue, as shown in the Japanese Unexamined Patent Publication 2003-229496 for example, ion implantation is implemented by protecting a STI region and it's adjacent active region with a mask and anneal processing is performed thereafter so that a source and/or a drain region is formed by diffusing impurities with in a active region in which an ion is not doped by ion implantation.

In a method of forming a source and a drain by annealing process, which diffuses impurities into a non-doped active region, however, it is difficult control concentration distribution of impurities in a source and/or a drain, if such source and/or drain is formed by lightly doped drain (LDD). Further, it should be avoided to diffuse impurities into the inside of a substrate. A source and/or a drain are insufficiently formed when annealing is not preformed, making a transistor element not operate as initially designed.

SUMMARY

An advantage of the present invention is to provide a method of a semiconductor device that can constrain crystal defects such as dislocation in a stress region yielded in a active region adjacent to an element isolation region in the STI structure and form a source and/or a drain without annealing process.

As a first aspect of the invention, a semiconductor device has a semiconductor substrate that includes an active region for forming transistor elements, which includes a gate, and an element isolation region for isolating each of the transistor elements from the other, which has STI structure. The method of manufacturing the semiconductor device comprises the following: First ions are doped into the surface of the semiconductor substrate in a region other than a stress region in the active region, which locates at the interface with the element isolation region, in the stress region, a potential stress caused by the difference between a material for the element isolation region and a material of the semiconductor substrate is generated, so that a first impurity region is formed in the active region in which the gate is not formed. Further, second ions, each of which mass is smaller than that of the first ions, are ion-implanted so that a second ion impurity region is formed in the stress region.

According to the aspect of the invention, first ions are ion-implanted so a to form source and/or a drain in a region other than a stress region in the active region. Next, second ions, each of which mass is smaller than that of the first ions, are ion-implanted, so that a second ion impurity region is formed in the stress region, constraining yield of damage in a stress region comparing to the conventional method of implanting the first ions onto the active region and forming a source and/or drain all over the active region. Therefore, defects of electric properties such as increase of leak current and decrease of break down voltage caused by the damage in the stress region can be reduced thereby. Further, the second impurity region in the stress region is formed, certainly forming the source and/or a drain, which are close to the element isolation region without performing annealing.

As second aspect of the invention, a semiconductor device has a semiconductor substrate that includes an active region for forming transistor elements, which includes a gate, and an element isolation region for isolating each of the transistor elements from the other, which has STI structure. The method of manufacturing the semiconductor device comprises the following: A fist mask is formed. The first mask covers a stress region, in which a potential stress is generated by forming the element isolation region and/or the difference between a material of the element isolation region and a material of the semiconductor substrate within at least the active region. Then, first ions are doped onto the surface of the semiconductor substrate so that a first impurity region for a source and/or a drain is formed in the active region in which the first mask and the gate is not formed. Next, the first mask is removed. Then, a second mask is formed in a region other than the active region. Further, second-ion implanting second ions are doped. Each of second ions has a mass, which is smaller than that of each of the first ions. A second ion impurity region is formed in the stress region thereby. Finally, the second mask is removed.

According to the second aspect of the invention, the first mask is formed on a stress region, which is interface between the element isolation region and the active region in the first mask forming. Next, first ions are doped so as to form a source and a drain in a active region except the stress region. The second mask is formed in a region except the active region thereafter. The second impurity, of which mass is smaller than that of the first impurity, is implanted, constraining damage in the stress region comparing to the conventional method of implanting the first ion onto the surface of the active region and forming a source and drain all over the active region. Therefore, defects of electric properties such as increase of leak current and decrease of break down voltage caused by the damage in the stress region can be reduced thereby. Further, the second impurity region in the stress region is formed, certainly forming the source and/or a drain, which are close to the element isolation region without performing annealing.

Further, according to the method of the invention, the mask may be made of a poly crystalline silicon or silicon nitride.

According to the third aspect of the invention, a semiconductor device having a semiconductor substrate comprises; an active region for forming transistors in which a gate is installed; an element isolation region for isolating each of transistors from others, that includes a STI structure; and a stress region at the interface with the element isolation region within the active region, in the stress region, a potential stress caused by the difference between a material for the element isolation region and a material of the semiconductor substrate is generated, so that a first impurity region for a source and/or a drain is formed in the active region in which the gate is not formed an/or forming the element isolation region. Further, it includes a first impurity region for a source and/or a drain is formed in the active region except the stress region and the gate. Further, it includes a second ion impurity region including a second impurity, each of which mass is smaller than the first impurity, at least in a region having the stress region.

According to this aspect of the invention, a first impurity region for a source and/or a drain is formed in the active region except the gate and stress region, and a second ion impurity region including a second impurity, each of which mass is smaller than the first impurity, is formed at least in a region having the stress region. This formation results in a source and drain in an active region except a gate. Thus, a source and/or drain is formed in a stress region by using the second impurity of which mass is smaller than the first impurity. Defects of electric properties such as increase of leak current and decrease of break down voltage caused by the damage in the stress region can be reduced thereby. Further, the second impurity region in the stress region is formed, certainly forming the source and/or a drain, which are close to the element isolation region without performing annealing.

BRIEF DESCRIPTION OF THE DRAWINGS

The invention will be described with reference to the accompanying drawings, wherein like numbers refer to like elements, and wherein.

DESCRIPTION OF THE EMBODIMENTS

A method of an embodiment of the invention is described referring to FIGS. 1A-1F.

Figure 1A:
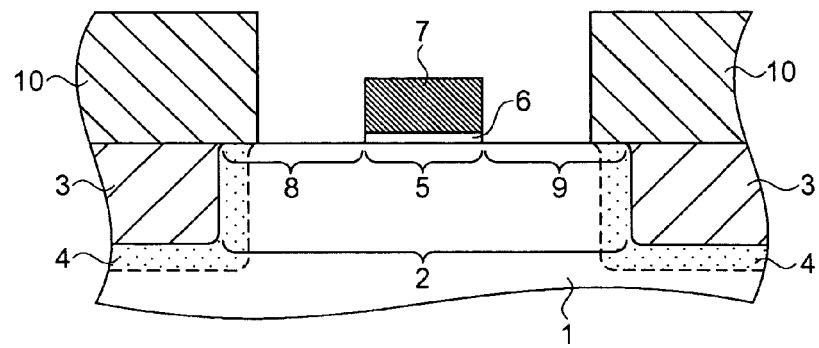
FIG. 1A to FIG. 1C are cross section views of processes for manufacturing a semiconductor device of the embodiment.
Figure 1B:
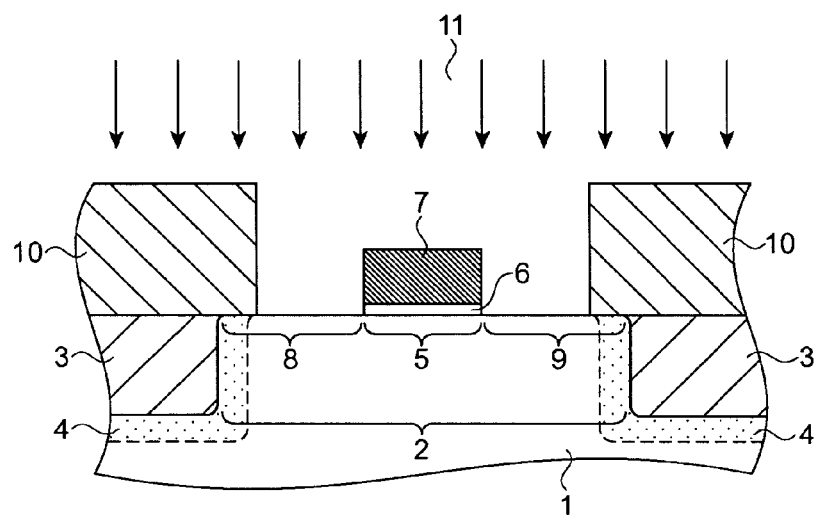
Figure 1C:
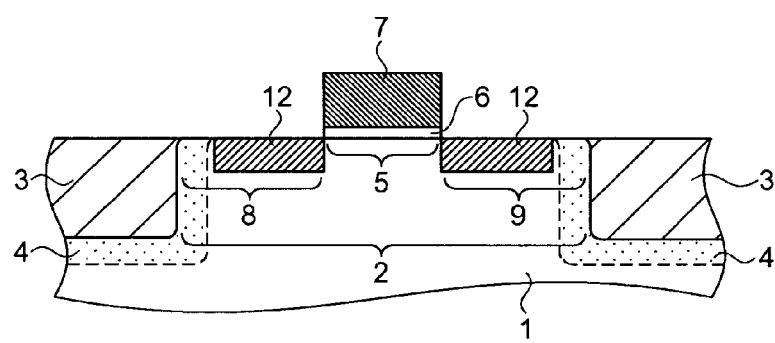
Figure 1D:
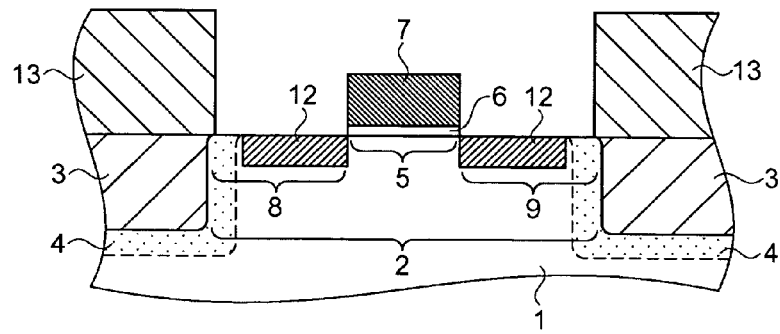
FIG. 1D to FIG. 1F are cross section views of processes for manufacturing a semiconductor device of the embodiment.
Figure 1E:
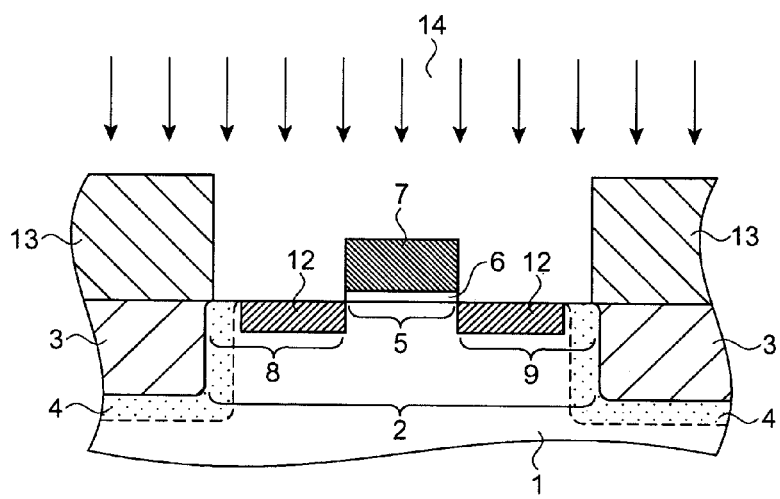
Figure 1F:
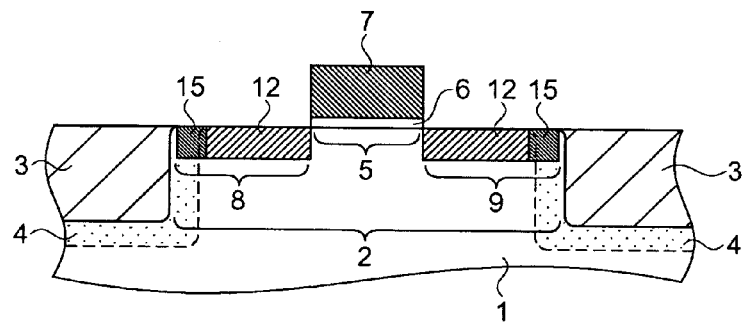

FIG. 1F shows a semiconductor substrate in which a metal insulator semiconductor field effect transistor (MISFET) is formed by the method of the embodiment.

A silicon substrate 1 as a semiconductor substrate comprises an active region 2, an element isolation region 3, a stress region 4, a gate 5, a first impurity region 12 and a second impurity region 15.

A MISFET element is formed in the active region 2 and the gate 5 is located in the almost center of the active region 2. The gate 5 includes a gate insulating film 6, made of silicon oxide or silicon nitride, and a gate electrode 7 made of polysilicon or metal such as tantalum. A source region 8 is formed in the left side of the active region 2 from the gate 7. A drain region 9 is formed in the right side of the active region 2 from the gate 7. The source region 8 has the almost same structure of the drain region 9. Hence, the source region 8 may be formed in the right side and the drain region 9 may be formed in the left side.

An element isolation region 3 is formed, sandwiching the active region 2. The element isolation region 3 has the STI structure and oxide silicon is embedded therein. Here, a method of forming the element isolation region 3 as a STI structure is described. A groove is formed within the silicon substrate by dry etching and the like and an oxide silicon film is embedded by chemical vapor deposition (CVD), as forming a STI structure. Additional silicon oxide film is removed by chemical mechanical polishing (CMP) and the surface is planarized.

The stress region 4 is formed at the interface between the element isolation region 3 and the silicon substrate 1. The stress region 4 is brought by solid-state difference regarding stress between an oxide film in the element isolation region 3 and silicon substrate 1, and damage caused by forming the element isolation region 3. Therefore, in the stress region 4, a potential stress is always applied, making crystal defect and/or dislocation easily generated in the area. The crystal defect and/or dislocation generated in an active area gives malfunction such as increase of leak current and decrease of break-down voltage to a MISFET, when it is operated.

The first impurity region 12 is formed by implanting the first impurity 11 in the active region 2 except the stress region 4.

The second impurity region 15 is formed by implanting the second impurity 14 onto the surface of the stress region 4 within the active region 2. The mass of the second impurity 14 is smaller than that of the first impurity 11.

The above structure has the following advantages: Namely, the first impurity region 12 for the source region 8 and the drain region 9 is formed in the active region 2 except the gate 5 by implanting the first impurity 11 in the active region 2 except the gate 5 and the stress region 4. The second impurity region 15 for the source region 8 and the drain region 9 is formed by implanting the second impurity 14, of which mass is smaller than that of first impurity 11, onto the surface of the stress region 4 within the active region 2. Accordingly, the source region 8 and the drain region 9 are formed by not only implanting the first impurity 11, but also implanting the second impurity 14, of which mass is smaller than that of first impurity 11, into the stress region 4 with in the active region 2. Hence, defects of electric properties such as increase of leak current and decrease of break down voltage caused by the damage in the stress region 4 can be reduced thereby. Further, the second impurity region 15 is formed in the stress region 4, certainly forming the source region 8 and the drain region 9 without annealing.

FIGS. 1A-1F show a process of forming a MISFET element of the invention. FIG. 1A shows a process for forming a first mask. FIG. 1B shows a process for fist ion implantation by implanting first impurity. FIG. 1C shows a process for removing a first mask. FIG. 1D shows a process for forming a second mask. FIG. 1E shows a process for second ion implantation by implanting second impurity. FIG. 1F shows a process for removing a second mask. Detail processes are explained thereafter.

In the process shown in FIG. 1A, a first photo resist layer 10 is formed as the first mask on the element isolation region 3 and the stress region 4 of the silicon substrate 1 with a photolithography.

In the process shown in FIG. 1B, As ion, which is relatively heavy, is ion-implanted as the first impurity ion 11. Here, the conditions for ion-implantation are: accelerated voltage under 150 Kev and dose amounts $1\times10^{16}$ (atom/cm$^2$).

The process shown in FIG. 1C removes the first resist 10 by wet process and dry etching.

After removing the first photo resist 10, the first impurity region 12, in which the first ion 11 is implanted, is formed in the source region 8 an the drain region 9 in the active region 2. Here, the first impurity region 12 comprises n-type region by implanting As ion. On the other hand, the first ion 11 is not implanted into the stress region 4 since the region is masked by the first photo resist 10 Thus, the stress region 4 does not receive any damages by As ion as the first impurity 11, constraining the yield of crystal defects and dislocation in the stress region 4.

The process shown in FIG. 1D forms the second photo resist layer 13 only on the element isolation region 3 by the same photo lithography as the process for forming the fist mask. Namely, the second photo resist 13 is formed so as to open the all area of the active region 2 including the stress region 4.

The process shown in FIG. 1E implants P ion as the second impurity 14, which is lighter than As ion. Here, the conditions for ion-implantation are: accelerated voltage under 150 Kev and dose amounts $1\times10^{16}$ (atom/cm$^2$) The second ion implantation condition is determined so that B ion is implanted at the same depth of the first impurity 12.

The process shown in FIG. 1F removes the second photo resist 13 as the same process in the first mask removing process. After removing the second photo resist 13, the second impurity region 15, in which the second ion is implanted, is formed in the stress region 4. Here, the second impurity region 15 comprises n-type region by implanting B ion.

Thus, the second impurity region is formed in the stress region 4 by implanting P ion, which is lighter than the As ion 11, into the stress region. This implantation can further constrain any damage applied to the stress region comparing to a case of ion implantation by using only As ion. Therefore, defects of electric properties such as increase of leak current and decrease of break down voltage caused by the damage in the stress region 4 can be reduced thereby. Further, the process for implanting the second ion is adjusted so that the depth of the second impurity toward the thickness of the silicon substrate 1 is the same of that of the first impurity 12. This adjustment can assure forming the source region 8 and the drain region 9 adjacent to the element isolation region 9 without annealing. In particular, the method of the embodiment is further advantageous for forming the source region 8 and drain region 9 with a LDD structure.

The method of the embodiment is not limited to the above mentioned, but may be modified as the following:

1. A polysilicon film or a silicon nitride film is formed as the first mask in the element isolation region 3 and the stress region 4.
2. The order of the above processes may be changed. Namely the process for forming the first mask and implanting the first ion may be performed after performing the process for forming the second mask and implanting the second ion.

What is claimed is:

1. A method of manufacturing a semiconductor device having a semiconductor substrate that includes an active region for forming transistor elements, which includes a gate, and element isolation regions for isolating the transistor elements separately each other, which have a STI structure, the method comprising;

a first ion implanting step of implanting first ions onto the surface of the semiconductor substrate in a region other than stress regions in the active region, which are located at junctions of the active region and the element isolation regions on both sides of the gate, wherein, in the stress region, a potential stress is generated by forming the element isolation regions and/or the difference between a material of the element isolation regions and a material of the semiconductor substrate, so that a first impurity region for a source and/or a drain is formed in the active region in which the gate is not formed; and a second ion implanting step of implanting second ions each of which mass is smaller than that of each of the first ions so that a second ion impurity region is formed in the stress region, wherein after the second ion implanting step, source and drain regions include the second impurity regions.

2. A method of manufacturing a semiconductor device having a semiconductor substrate that includes an active region for forming transistor elements, which includes a gate, and element isolation regions for isolating the transistor elements separately each other, which have STI structure, the method comprising;

forming a first mask that covers a stress region, in which a potential stress is generated by forming the element isolation regions and/or the difference between a material for the element isolation region and a material of the semiconductor substrate within at least the active region, wherein the stress region is located at junctions of the active region and the element isolation regions on both sides of the gate;

a first ion implanting step of implanting first ions onto the surface of the semiconductor substrate so that a first impurity region for a source and/or a drain is formed in the active region in which the first mask and the gate is not formed;

removing the first mask;

forming a second mask in a region other than the active region;

a second ion implanting step of implanting second ions each of which mass is smaller than that of each of the first ions so that a second ion impurity region is formed in the stress region, wherein after the second ion implanting step, the source and/or drain includes the second impurity region; and removing the second mask.

3. The method of manufacturing a semiconductor device according to claim 2, wherein the mask is made of a poly crystalline silicon or silicon nitride.

* * * * *